US010041839B2

(12) United States Patent
Cortigiani et al.

(10) Patent No.: US 10,041,839 B2
(45) Date of Patent: Aug. 7, 2018

(54) THERMAL OBSERVER AND OVERLOAD PROTECTION FOR POWER SWITCHES

(71) Applicant: Infineon Technologies AG, Neubiberg (DE)

(72) Inventors: Fabrizio Cortigiani, Padua (IT); Adolfo De Cicco, Castel d'Azzano (IT)

(73) Assignee: Infineon Technologies AG, Neubiberg (DE)

( * ) Notice: Subject to any disclaimer, the term of this patent is extended or adjusted under 35 U.S.C. 154(b) by 877 days.

(21) Appl. No.: 14/337,973

(22) Filed: Jul. 22, 2014

(65) Prior Publication Data

US 2015/0030051 A1  Jan. 29, 2015

(30) Foreign Application Priority Data

Jul. 23, 2013 (EP) .................................... 13003689

(51) Int. Cl.

| | | |
|---|---|---|
| G01K 1/26 | (2006.01) | |
| G01K 1/02 | (2006.01) | |
| H02H 5/04 | (2006.01) | |
| H03K 17/082 | (2006.01) | |
| H02H 6/00 | (2006.01) | |
| H02H 3/07 | (2006.01) | |
| H03K 17/08 | (2006.01) | |

(52) U.S. Cl.
CPC .............. *G01K 1/026* (2013.01); *H02H 3/07* (2013.01); *H02H 5/04* (2013.01); *H02H 6/00* (2013.01); *H03K 17/0822* (2013.01); *H03K 2017/0806* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,654,260 | B2 * | 11/2003 | Okayama | ............ H02M 5/4505 363/132 |
| 7,057,240 | B2 * | 6/2006 | Topp | ....................... F02P 3/051 257/368 |
| 8,947,842 | B2 * | 2/2015 | Feldtkeller | ............... G01K 7/01 361/103 |
| 2006/0034343 | A1 | 2/2006 | Rotem | |

(Continued)

FOREIGN PATENT DOCUMENTS

CN      102998016 A      3/2013

OTHER PUBLICATIONS

Office Action, in the Chinese language, from counterpart Chinese Application No. 201410523987.5, dated Oct. 8, 2016, 9 pp.

*Primary Examiner* — Lisa Caputo
*Assistant Examiner* — Nasir U Ahmed
(74) *Attorney, Agent, or Firm* — Shumaker & Sieffert, P.A.

(57) ABSTRACT

The present disclosure proposes the placing of temperature sensors embedded in the power semiconductor device. In this, at least one of the embedded temperature sensors is placed within or close to the heat source, active areas or channels of the power semiconductor circuit, and at least one of the embedded temperature sensors is placed more apart from the heat source, active areas or channels of the power semiconductor circuit. Furthermore, a new the temperature measurement method is provided, with timing of the temperature measurement and adjusting measurement parameters to appropriate threshold values.

19 Claims, 4 Drawing Sheets

(56) References Cited

U.S. PATENT DOCUMENTS

| | | | |
|---|---|---|---|
| 2010/0079190 A1* | 4/2010 | Cortigiani | H03K 17/0822 |
| | | | 327/378 |
| 2011/0051302 A1* | 3/2011 | Dibra | H03K 17/0822 |
| | | | 361/86 |
| 2011/0156799 A1* | 6/2011 | Zanardi | G01K 3/005 |
| | | | 327/512 |
| 2013/0027830 A1* | 1/2013 | Illing | H02H 7/222 |
| | | | 361/103 |

* cited by examiner

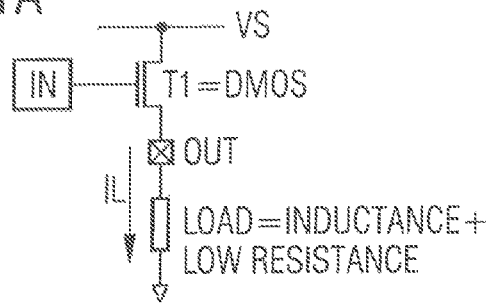
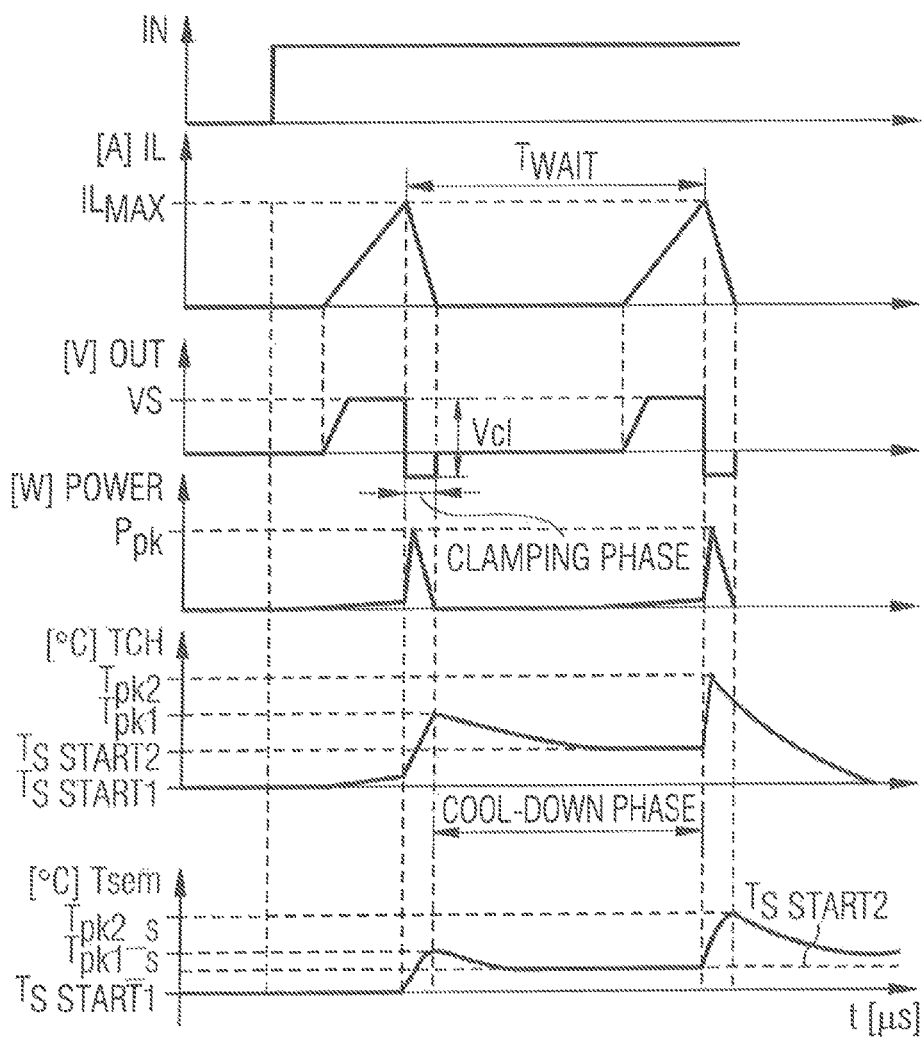

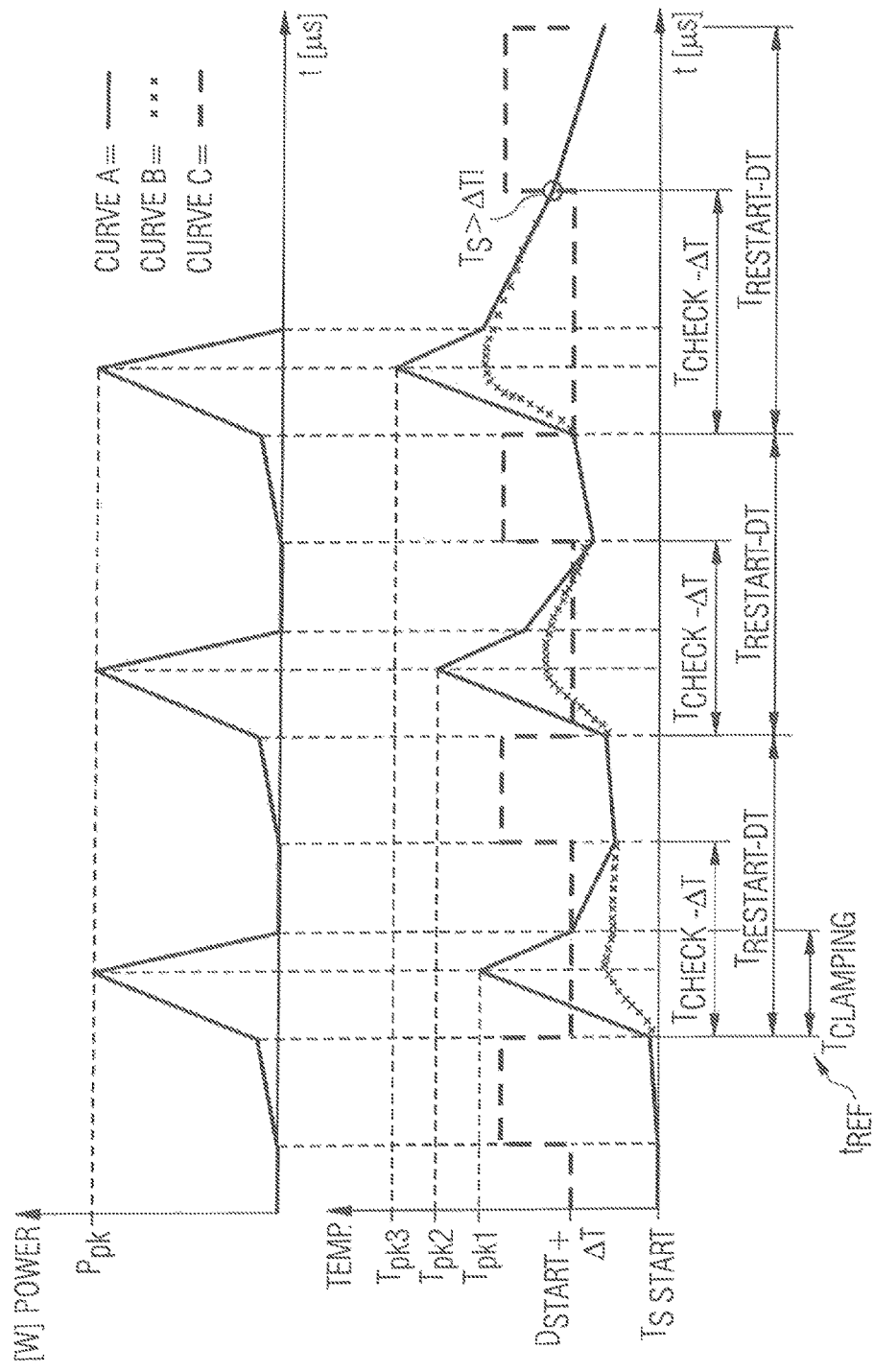

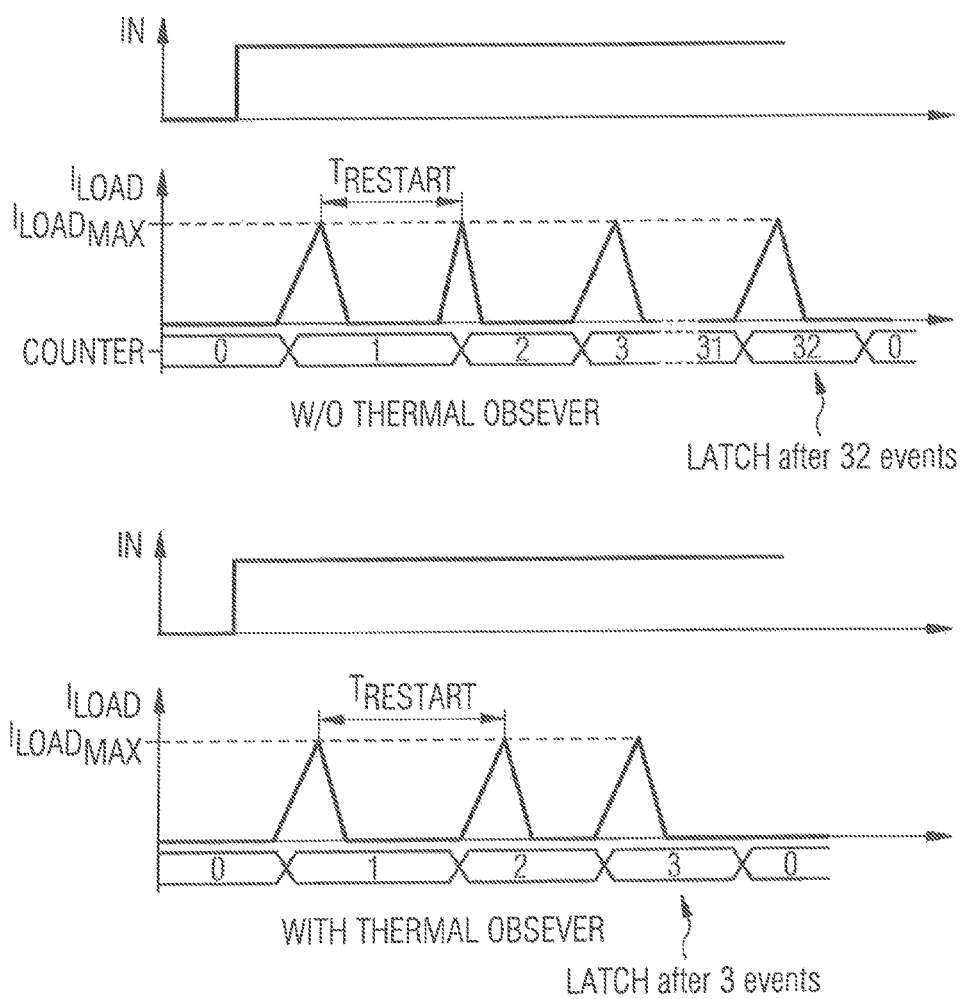

THERMAL OBSERVER AND OVERLOAD PROTECTION FOR POWER SWITCHES

This application claims priority to EP Patent Application No. 13003689.0, the entire content of which is incorporated by reference herein.

SUMMARY

The present disclosure is related to the field of semiconductor devices and refers to detecting and for protecting faulty operating states that lead to a rise in temperature, as in the case of short-circuit condition. More specifically, the present disclosure refers to a device for a thermal observation for power semiconductor circuits or switches and to a method for overload protection for power semiconductor circuits or switches.

The present disclosure addresses thermal observer and overload protection for power semiconductor circuits or switches. Certain kinds of power semiconductor switches are usually called "smart switches" and may include a power transistor (i.e. in high side configuration) and control-chip for management. In particular, control chips may include circuit for over-current or over-temperature detection for protection against overload condition.

Power semiconductor circuits or switches can be used to provide electrical loads with electrical power. In the field of protection for power semiconductor circuits or switches, the energy capability is a limiting factor for device reliability under short circuit/overload condition. Known power semiconductor circuits comprise at least one controllable power semiconductor switch that produces waste heat which causes a danger of overheating the power semiconductor circuit or switch which might lead to a short circuit event. To control said waste heat and the danger of overheating one or more temperature sensors can be thermally coupled to the power semiconductor switch.

In the current art, a short circuit event within a power semiconductor circuit or switch was protected by current limitation followed by over-temperature or delta temperature switch-off, and reactivation of a channel of the power circuit or device is allowed, if the temperature of a Diffusion Metal Oxide Semiconductor (DMOS) element declines below a given absolute or relative reference value. For instance, known PROFET/PROFET+® switches work with this protection scheme. Other known protection implementations are based on over-current switch-off and limited number of retries to allow load activation (SPOCFL® family, SPOC+®).

Since the thermal coupling between the temperature sensor and the active area of the power semiconductor circuit or switch is not perfect, in particular, when it is placed only in a control chip due to technology limitations, the temperature sensor may not react or may not react promptly enough to indicate the temperature of the active area during a demagnetization. As a result, a control circuit is not able to immediately detect an over-heating of the semiconductor device, and in consequence, the DMOS does not homogeneously cool down, such that local peak temperatures may occur without a possibility given to detect them in a short time period.

This is may lead to the generation of hot spots within the semiconductor circuit or switch, consequent filamentation and early destruction of the DMOS device. Such a critical hot spot temperature may also occur in an earlier operation stage due to multiple restart situations. This is because the heating generates hot spots in the hottest area of the DMOS which may be not able to cool down fast enough due to consecutive retries in a close series, despite the information of the temperature sensors' system, which might not indicate destructive temperatures exceeding predetermined limitations.

The known delta temperature protection concept uses a reliability improvement during repetitive short circuit condition, but still can not avoid the high energy dissipated after switch off, especially in a multiple restart scenario. Other known protection concepts rely on a full calculation of the device temperature starting from the full knowledge of the thermal properties and the starting temperature. Such known concepts have the backlash of high effort or circuit area needed and the costs involved to emulate long thermal time constants. In new generations of DMOS devices, the active area is reduced for cost reasons, and under some application conditions very high power peaks and energy densities have to be dissipated by a small silicon area. Hence, there is a need for an effective high temperature and overload protection concept.

This goal can be achieved by means of the subject-matters of the independent claims. Further embodiments of the present disclosure are defined by the dependent claims, respectively.

According to an aspect of the present disclosure, in a chip-by-chip device, a power-power-chip is provided comprising the power transistor and temperature sensors, i.e. a hot temperature sensor HS and a cold temperature sensor CS, placed in the power-chip. At least a one of the temperature sensors, i.e. the hot temperature sensor HS, is placed close to the power transistor, and at least another one of the temperature sensors, i.e. the cold temperature sensor CS, is placed in a further distance from the power transistor. Furthermore, a control-chip is provided comprising circuits located in the control-chip to determine the temperature information using the information received from the temperature sensors HS and CS placed in the power-chip.

According to another embodiment of the present disclosure, when an overload of the power-chip is detected a dynamic temperature measurement can be performed comparing the temperature detected by the hot temperature sensor HS with the temperature detected by the cold temperature sensor CS at a fixed point of time after the switch-off due to over-current detection. Said fixed point of time is chosen to best compromise between accuracy measure and coupling between DMOS temperature and sensor temperature detection. In consequence, a given thermal network can be evaluated without any complex calculation and the die temperature can be predicted in a more precisely manner. Furthermore, said fixed point of time for the temperature measurement can be chosen to have a good accuracy in voltage (some mV range) and when the thermal coupling is optimum.

According to still another aspect of the present disclosure the above object is achieved by limiting excessive number of retries, i.e. limiting multiple restart situations for the semiconductor device, circuit or switch. According to another aspect of the present disclosure the number of retries is limited without an substantial impact on the driving capability of the power semiconductor device, circuit or switch, and thereby improving its robustness via thermal observation during clamping and/or demagnetization phase of the power semiconductor device, circuit or switch.

Devices and techniques according to the present disclosure may provide limitation of an excessive number of retries during short circuit condition within a power semiconductor device, circuit or switch. According to another aspect of the present disclosure, a thermal observation is provided outside the switch-off. According to still another aspect of the present disclosure, a demagnetization phase is performed within the power semiconductor device, circuit or switch. Thereby, devices according to the present disclosure may provide improvement for temperature detection with less area demand within the semiconductor circuit or switch.

In terms of a general concept of the present disclosure, in a thermal network defining the thermal coupling between a DMOS circuit or device and a thermal sensor, detection of the dynamic temperature difference or delta temperature between a hot temperature sensor and a cold temperature sensor is performed such that the measurement is done at a time after the switch-off and when it can be assumed that the coupling between the temperature sensor and the average DMOS sensor has returned into a predetermined range.

As a result, the techniques and devices of the present disclosure make it possible to evaluate in advance, whether a successive restart of the temperature of the semiconductor circuit, switch or device might generate excessive stress for the device or if a latched fault condition or status is needed. This is highly improving reliability and endurance of the power device. In conclusion, the present disclosure provides a new simplified thermal observer that can help to overcome one or more of the following limitations in the prior art:
  Excessive number of retries during short circuit conditions
  Poor thermal detection due to bad thermal coupling between sensor and DMOS
  High silicon area demand to evaluate the thermal network According to an aspect of the present disclosure a semiconductor circuit arrangement is provided, comprising:
a power semiconductor device with at least one active area;
a first temperature sensor embedded in the power semiconductor device;
wherein the first temperature sensor is placed within or close to the at least one active area; wherein a second temperature sensor embedded in the power semiconductor device; and the second temperature sensor is placed apart from the at least one active area in a further distance from the at least one active area than the first temperature sensor.

In some examples, the first temperature sensor is placed at a position where the highest temperature during operation of the power semiconductor device are expected to occur, and the second temperature sensor is placed at a position where the lowest temperature during operation of the power semiconductor device are expected to occur.

In some examples, the semiconductor circuit arrangement further comprises at least one comparator configured to compare measurement signals received from the first and second temperature sensors.

In some examples, the semiconductor circuit arrangement further comprises control logic circuit configured to evaluate results of the at least one comparator and/or measurement signals of the first and second temperature sensors.

In some examples, the control logic circuit is configured to generate at least one alert signal or flag based on the results of the at least one comparator and/or based on the measurement signals of the first and second temperature sensors.

In some examples, the control logic circuit is configured to perform one or more of:
  compare the temperature measured by the first and/or second temperature sensor with a predetermined temperature threshold;
  detect a temperature difference between the first temperature sensor and the second temperature sensor;
  detect an over-temperature condition of the at least one active area;
  detect an over-current condition of the at least one active area;
  detect a short-circuit condition of the power semiconductor device;
  switch off operation of the at least one active area and/or the power semiconductor device;
  initiate restart of operation of the at least one active area and/or the power semiconductor device;
  initiate repeated restart of operation of the at least one active area and/or the power semiconductor device;
  count the number of restarts of operation of the at least one active area and/or the power semiconductor device;
  limit the number of restarts of operation of the at least one active area and/or the power semiconductor device;
  install a first waiting time before a restart of operation of the at least one active area and/or the power semiconductor device;
  install a second waiting time before a repeated restart of operation of the at least one active area and/or the power semiconductor device;
  initiate measurement of the first and second temperature sensors;
  initiate repeated measurement of the first and second temperature sensors;
  initiate repeated measurement of the temperature difference between the first and second temperature sensors;
  initiate repeated measurement of the first and second temperature sensors after a predetermined time period after the switch-off due to an over-current detection in the at least one active area and/or the power semiconductor device;
  count the number of measurements of the first and second temperature sensors;
  limit the number of measurements of the first and second temperature sensors;
  install a third waiting time before a repeated measurement of the first and second temperature sensors;
  install a fourth waiting time before a repeated restart of operation of the power semiconductor device;
  install a fifth waiting time between measurements of the first temperature sensor and measurements of the second temperature sensor;
  perform a demagnetization phase within the power semiconductor device;
  vary or adjust any waiting times and/or thresholds.

In some examples, the control logic circuit is configured to switch off operation of the at least one active area and/or the power semiconductor device, if one ore more of the following conditions are detected:
  the temperature of the first and/or second temperature sensor exceeds a predetermined temperature threshold;
  the number of restarts of operation of the at least one active area and/or the power semiconductor device exceeds a predetermined threshold;
  the number of measurements of the first and second temperature sensors exceeds a predetermined threshold;
  the temperature of the first and/or second temperature sensor does not fall under a predetermined threshold within a predetermined time period after switch off operation of the at least one active area and/or the power semiconductor device.

In some examples, the control logic circuit is configured to restart of operation of the at least one active area and/or the power semiconductor device, if one ore more of the following conditions are detected:
  the temperature of the first temperature sensor is lower than a predetermined threshold;
  the temperature of the second temperature sensor is lower than a predetermined threshold;
  the temperature difference between of the first and/or second temperature sensor is lower than a predetermined threshold;
  a sixth waiting time after switch off operation of the at least one active area and/or the power semiconductor device exceeds a predetermined threshold.

In some examples, the control logic circuit is configured to control power supply for the at least one active area and/or the power semiconductor device based on the evaluation of the measurement signals from the first and second temperature sensors.

In some examples, the control logic circuit and/or the at least one comparator is arranged on a control chip.

According to another aspect of the present disclosure a method is provided for operating a power semiconductor circuit arrangement comprising a power semiconductor device with at least one active area, the method comprising: measuring a first temperature using a first temperature sensor embedded in the power semiconductor device and placed within or close to the at least one active area; measuring a second temperature using a second temperature sensor embedded in the power semiconductor device and placed apart from the at least one active area in a further distance from the at least one active area than the first temperature sensor; and evaluating the measurement signals from the first and second temperature sensors.

In some examples, the method further comprises comparing the measurement signals received from the first and second temperature sensors.

In some examples, the method further comprises evaluating results of the at least one comparator and/or measurement signals of the first and second temperature sensors.

In some examples, the method further comprises generating at least one alert signal or flag based on the results of the at least one comparator and/or based on the measurement signals of the first and second temperature sensors.

In some examples, the method further comprises one or more of:
  comparing the temperature measured by the first and/or second temperature sensor with a predetermined temperature threshold;
  detecting a temperature difference between the first temperature sensor and the second temperature sensor;
  detecting an over-temperature condition of the at least one active area;
  detecting an over-current condition of the at least one active area;
  detecting a short-circuit condition of the power semiconductor device;
  switching off operation of the at least one active area and/or the power semiconductor device;
  initiating restart of operation of the at least one active area and/or the power semiconductor device;
  initiating repeated restart of operation of the at least one active area and/or the power semiconductor device;
  counting the number of restarts of operation of the at least one active area and/or the power semiconductor device;
  limiting the number of restarts of operation of the at least one active area and/or the power semiconductor device;
  installing a first waiting time before a restart of operation of the at least one active area and/or the power semiconductor device;
  installing a second waiting time before a repeated restart of operation of the at least one active area and/or the power semiconductor device;
  initiating measurement of the first and second temperature sensors;
  initiating repeated measurement of the first and second temperature sensors;
  initiating repeated measurement of the temperature difference between the first and second temperature sensors;
  initiating repeated measurement of the first and second temperature sensors after a predetermined time period after the switch-off due to an over-current detection in the at least one active area and/or the power semiconductor device;
  counting the number of measurements of the first and second temperature sensors;
  limiting the number of measurements of the first and second temperature sensors;
  installing a third waiting time before a repeated measurement of the first and second temperature sensors;
  installing a fourth waiting time before a repeated restart of operation of the power semiconductor device;
  installing a fifth waiting time between measurements of the first temperature sensor (HS) and measurements of the second temperature sensor;
  performing a demagnetization phase within the power semiconductor device;
  varying or adjusting any waiting times and/or thresholds.

In some examples, the operation of the at least one active area and/or the power semiconductor device is switched off, if one ore more of the following conditions are detected:
  the temperature of the first and/or second temperature sensor exceeds a predetermined temperature threshold;
  the number of restarts of operation of the at least one active area and/or the power semiconductor device exceeds a predetermined threshold;
  the number of measurements of the first and second temperature sensors exceeds a predetermined threshold;
  the temperature of the first and/or second temperature sensor does not fall under a predetermined threshold within a predetermined time period after switch off operation of the at least one active area and/or the power semiconductor device.

In some examples, the operation of the at least one active area and/or the power semiconductor device is restarted, if one ore more of the following conditions are detected:
  the temperature of the first temperature sensor is lower than a predetermined threshold;
  the temperature of the second temperature sensor is lower than a predetermined threshold;
  the temperature difference between of the first and/or second temperature sensor is lower than a predetermined threshold;
  a sixth waiting time after switch off operation of the at least one active area and/or the power semiconductor device exceeds a predetermined threshold.

In some examples, the method further comprises controlling power supply for the at least one active area and/or the power semiconductor device based on the evaluation of the measurement signals from the first and second temperature sensors.

BRIEF DESCRIPTION OF THE DRAWINGS

The accompanying drawings are included to provide a further understanding of the present disclosure and are incorporated in and constitute a part of this specification. The drawings illustrate the embodiments of the present disclosure and together with the description serve to explain the principles of the techniques and devices of this disclosure. Other embodiments of the present disclosure and many of the intended benefits of the present disclosure will be readily appreciated as they become better understood by reference to the following detailed description. The elements of the drawings are not necessarily to scale relative to each other. Like reference numerals designate corresponding or similar parts.

FIG. 1A shows a simplified scheme of a semiconductor power switch circuit or channel to which the features of the present disclosure can be applied;

FIG. 1B shows a diagram illustrating the behavior of a semiconductor power switch circuit or channel shown in FIG. 1A in case of a short-circuit condition and during restarts of operation;

FIG. 2 shows another diagram illustrating the behavior of a semiconductor power switch circuit or channel shown in FIG. 1A in case of a short-circuit condition and during restarts of operation;

FIG. 3 shows a diagram representing a comparison between a standard dynamic temperature protection and a dynamic temperature protection using the new thermal observer according to an embodiment of the present disclosure.

DETAILED DESCRIPTION

Figure 4:
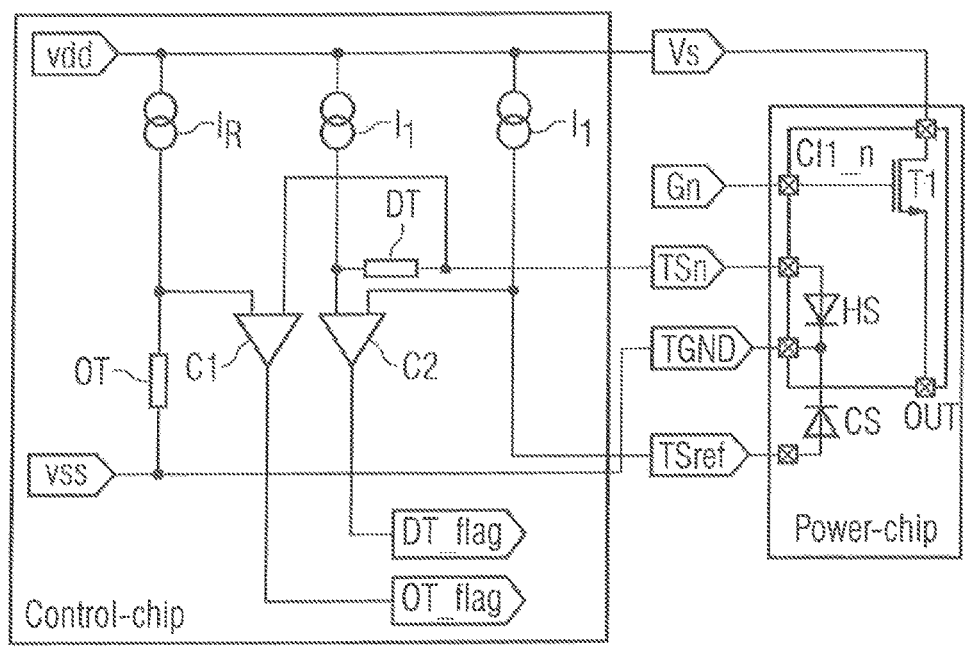
FIG. 4 shows another embodiment of according of the present disclosure in a perspective view.

In the following detailed description, reference is made to the accompanying drawings, which form a part hereof, and in which is shown by way of illustration specific embodiments in which the techniques and devices of this disclosure may be practiced. Because components of embodiments of the present disclosure can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

FIG. 1A shows a simplified scheme of a power semiconductor circuit or channel to which the techniques and/or features of present disclosure can be applied. In FIG. 1B, the following details are shown:

T1: power transistor in high side configuration or DMOS device
IN: command line to switch-on the power transistor (from control-chip)
VS: voltage supply.
OUT: source of the power transistor.
LOAD: load connected to the source of the power transistor.
IL: current flowing to the load, once the power transistor is switched-on.

The DMOS power transistor T1 in high side configuration comprises source and drain is connected to the load, wherein the source OUT of the power transistor T1 is connected to a load comprising an inductance and a low resistance to emulate a short-circuit to ground of the wire harness. In the illustrated case, the load is schematized as inductance (e.g. 10 µH) and a low resistance (e.g. 100 mOhm). The drain of the power transistor T1 is coupled to a voltage supply VS, e.g. carrying battery voltage.

Via a command or control line IN a command to switch on the power transistor T1 from a control-chip (not shown) can be provided to the power transistor T1. If the power transistor T1 is switched on, current IL is flowing from the source OUT of the power transistor T1 to the load.

In this arrangement, during a clamping/demagnetization phase the energy must be dissipated through the DMOS power transistor T1 itself, wherein the temperature of the power transistor T1 is increasing accordingly with the thermal network from the junction to its ambience. Therefore, a temperature sensor is used to detect over-heating of the DMOS power device circuit and to protect the device against over-heating, e.g. in a clamping/demagnetization phase caused by a short-circuit condition. The temperature sensor can be embedded directly in the power chip or placed in the control chip for over-temperature or dynamic temperature detection.

When the power transistor is switched-on, the current is rising immediately until the maximum current $IL_{max}$ is detected. This event is usually called over-current detection and one of the internal protection function present in this kind of semiconductor power device or channel. Once a over-current condition OC is detected, the power transistor is switched-off with a fast shut-down and it stays off for a waiting time $T_{wait}$. After the waiting time $T_{wait}$ the channel is restarted to be switched on again. It is desirable to perform this restart of the semiconductor power device or channel as prompt as possible to provide high current capability to the load.

When the semiconductor power device or channel is switched on, the source voltage of the power transistor T1 is rising in accordance with the current flowing until it reaches the supply voltage VS, e.g. the battery voltage. In this condition the power transistor T1 is fully on. Once an over-current condition OC is detected and the current supplied to the load is dropping, the source is going below ground because the external inductance still tends to force the current. The source voltage is then clamped internally by a control-chip at a certain clamping voltage value $V_{cl}$. This condition is called clamping and/or demagnetization phase.

The power signal shown in FIG. 1B illustrates the power quantity to be dissipated through the device during the clamping/demagnetization phase. The maximum power quantity $P_{pk}$ to be dissipated through the device during the clamping/demagnetization phase is given by $IL_{max}*V_d$. The signal Tch shown in FIG. 1B illustrates the channel junction temperature of the power transistor T1. During the clamping/demagnetization phase, the power and so the energy must be dissipated by the power transistor T1 and therefore the junction temperature is increasing accordingly with the thermal network from the junction to the environment, wherein the temperature sensor is used to detect over-heating. Therefore, the junction temperature starts from a certain value (i.e. Tjstart1) and reaches a first peak value dependent on the external components (Tpk1) during the clamping/demagnetization phase.

Once the external inductance of the load is completely discharged, the power is gone and the junction temperature can decrease during a cool-down phase. Once the cool-down phase finishes, the subsequent restart of operation can be commanded by the control-chip via command line IN. In case the restart of operation happens before the junction temperature comes back to its initial value Tjstart1, the operation of the device starts from a higher value Tjstart2 of the junction temperature and the second peak temperature Tpk2 may be higher than the first peak temperature Tpk1.

Therefore, after a certain maximum numbers of retries to restart operation of the device—depending on the application requirement, e.g. a maximum of 32 restarts, as shown in FIG. 3—the final peak temperature value may be very high and jeopardize functionality of the device. To avoid overheating damages to the device the temperature sensor is used for over-temperature or dynamic temperature detection. The signal $TS_{en}$ shown in FIG. 1B illustrates the channel junction temperature detected by a temperature sensor that can be embedded directly in the power chip of the power transistor in a control chip external to the power chip.

Due to imperfect thermal coupling between the temperature sensor and the active area, the temperature sensor may not react promptly enough to report the active area temperature during demagnetization. In such cases, it can be possible that the maximum temperature is Tpk1_s<Tpk1. An imperfect thermal coupling between the temperature sensor and the active area within the power chip may particularly present, if the temperature sensor is placed in the control chip, because of the distance between control chip and power chip.

As a result of delayed report of the temperature from the temperature sensor during demagnetization, the control circuit may not be able to detect immediately an over-heating of the device and as a consequence the DMOS power transistor T1 can not cool down homogeneously. In consequence, high local temperatures may occur at the power device and the power transistor T1 without the possibility to detect this high local temperatures in a timely manner.

This may lead to early destruction of the power device, generating hot spots and filamentation caused thereby. Such a critical hot spot temperature may also be reached faster, if multiple restarts are performed. This is because the heat may generate a hot spot in the hottest area of the DMOS power device may be not able to cool down fast enough due to consecutive retries following close after each other, despite the information of the temperature sensor, that may not show dangerous hot spot temperatures.

According to an aspect of the present disclosure this problem is solved by limiting excessive number of retries to restart operation of the semiconductor power device or circuit. This limitation of an excessive number of retries to restart operation is without an impact on driving capability of the power device, and thus improving the robustness of the power device via thermal observation during the clamping/demagnetization phase.

FIG. 2 shows another diagram illustrating the behavior of a semiconductor power switch circuit or channel shown in FIG. 1A with inductive wire harness in case of a short-circuit condition and during restarts of operation. The diagram shown in FIG. 1B illustrates signals sequences that occur at the respective lines and couplings shown in FIG. 1A. In particular, FIG. 1B illustrates thermal observer timing and thresholds, such as the temperature at the checking point T_check_$\Delta$T, the waiting time Trestart_$\Delta$T and the delta temperature threshold $\Delta$T_threshold.

After each over-current detection or retry to restart operation of the device, the temperature of the device is rising during the clamping/demagnetization phase, since the high power and corresponding energy must be dissipated through the power transistor T1. Therefore, after each over-current detection or retry to restart operation, a measurement of the dynamic temperature is performed after a certain time period has lapsed. In this condition, a measurement of the dynamic temperature is performed between a hot temperature sensor embedded in the power transistor and a cold temperature sensor placed in a location and in a manner that the respective temperature at the cold temperature sensor is not increasing during the clamping/demagnetization phase.

As shown in FIG. 2, with $TJ_{start}$ being the temperature of the cold temperature sensor, the difference or delta temperature measurement ($\Delta$T) between the hot temperature sensor and the cold temperature sensor is done after a certain time period Tcheck_$\Delta$T has lapsed. This delta temperature time check may be chosen, such as 80 µs after the switch-off time t1 or t2. In case the measured temperature is lower than a certain threshold, i.e. $\Delta Tj_{res}$=40° C., this is indicating an temperature increase of the active area within the power circuit of more than 150° C. during clamping/demagnetization phase. In consequence, a retry to restart operation may be allowed after a certain waiting time Trestart_$\Delta$T (after 160 µs in the illustrated example) or if, the temperature at the checking point T_check$\Delta$T is higher than the threshold value, a latch condition is performed, which corresponds to the third retry shown in FIG. 2.

According to this aspect, the present disclosure makes use of the dynamic temperature change information available and the thermal network properties after every single switch-off of the power semiconductor circuit. In other words, given a thermal network and a time-limited power pulse, e.g. as performed for a clamping/demagnetization phase after switch-off of the power device, a measurement in a single time instant after the switch-off can be sufficient to evaluate the maximum dynamic temperature of the semiconductor power device or die similar to a power peak application of the power semiconductor circuit.

In conclusion, if an excessive power device or die temperature has been determined at the measurement time, a subsequent restart of operation can be evaluated as excessive stress for the power semiconductor circuit or device and a latched fault condition or status can be reached. Thereby, the devices according to the present disclosure can provide improvement of device reliability.

Exemplary applications cases of the present disclosure have shown that in current silicon areas (several to some 10 sqmm), thermal coupling of embedded temperature sensors in the range of several µs of delay/$\tau$, and typical thermal coupling between embedded sensor and reference sensor are in the range of milliseconds. Therefore, the dynamic temperature evaluation after 50-200 µsec apart from applied power peak (1 kW/mm2 peak range for 5-40 µsec) can be reliable and convenient to implement. Thus, a complex calculation for thermal prediction is not needed anymore.

For correct $\Delta$T sensing, the reference sensor is substantially insensible to the temperature increase at least within given timings. There may be a full flexibility for most of the key parameters: $\Delta$T, instant of evaluation after switch-off ($\Delta$T_check), waiting time before restart, etc. The chosen values can be tuned according to reliability, package and silicon thermal properties, or application conditions. The flexibility will be at single product/device level, but may also be tunable via trimming or backend or user configuration via, as example, NVM programming.

Referring to thermal simulations, a compromise between sensor coupling to the temperature of the DMOS power transistor and time for evaluation of an over-heated condition—before allowing a higher $\Delta$T threshold, to achieve better accuracy of sensing—can be chosen to fulfill the following general principle: Given the thermal network defining the relation between sensor and DMOS power transistor, a coupling error can be compensated by a suitable and properly equalized ΔT threshold.

The present disclosure can be applied to any type, dimensioning and usage of the above mentioned parameters. For instance, the switch-off condition may be a function which derives over-temperature by the absolute value of the hot sensor added to an extrapolated value by the ΔT value in the thermal network.

Another benefit of the present disclosure is provided in case of poor thermal coupling between temperature sensors and the DMOS circuit, like in chip on chip, or chip by chip power switches, where the temperature sensor can be present only in the control chip, due to technology limitations or cost reasons.

Referring to FIG. 2 again, the curve designated with POWER illustrates the amount of power that the power transistor must be dissipated during the clamping phase. The curves designated with TEMP illustrate different temperature courses over the time, respectively:

Temperature curve A illustrated by diagonal dashes represents the temperature at the junction of the power transistor T1 shown in FIG. 1. This junction temperature of the power transistor T1 increases during the clamping event that lasts for the time period Tclamping.

Temperature curve B illustrated by crosses represents the temperature of the sensor embedded in the power transistor T1. This sensor temperature of the sensor embedded in the power transistor T1 increases during the clamping phase event that lasts for the time period Tclamping. In more detail, the temperature sensor of the sensor embedded in the power transistor T1 increases with a certain constant time due to the thermal network between the junction of the power transistor T1 and the encompassing package.

Temperature curve C illustrated by a dashed line represents the course of the value ΔT_threshold for the delta-temperature generated by the control chip.

After a certain time period Tcheck_ΔT has lapsed, a sample and hold measurement of the temperature is performed and if the sampled temperature is lower than the ΔT_threshold, a next restart of operation is allowed after the time period Trestart_ΔT. Otherwise the channel is latched as in the last retry event, wherein Tj>ΔT.

The time Tcheck_ΔT is chosen in order to provide a good coupling between the real temperature of the power transistor and the temperature detected by the sensor. At the beginning a mismatch between the real temperature of the power transistor and the temperature detected by the sensor due to the thermal network occurs. At the beginning the value of ΔT_threshold can be set a certain value to improve immunity against noise irritations and in the following the value of ΔT_threshold can be decreased to a typical value when an over-current (OC) condition is detected.

An example of different behavior of the semiconductor circuit or device is illustrated in FIG. 3 deviating from the behavior illustrated in FIG. 2. In FIG. 3 a diagram representing a comparison between a standard dynamic temperature protection and a dynamic temperature protection using the new thermal observer according to an embodiment of the present disclosure is shown. In the case illustrated in FIG. 3, without a thermal observer the device in a typical short-circuit condition typically performs a total of 32 retries to restart operation of the device. With a thermal observer according to the present disclosure, a maximum of 2 retries can be admitted with a saving of total 30 retries. Thus, robustness, performance and endurance of the semiconductor circuit or device is improved.

In FIG. 4 illustrates an arrangement with a power-chip and a control-chip adapted to perform the techniques of the present disclosure. According to an aspect of the present disclosure, in a chip-by-chip device, a power-chip is provided comprising an active area or channel Ch_n with a power transistor T1. Temperature sensors HS and CS are placed in the power-chip, wherein the first hot temperature sensor HS is placed close to the active area Ch_n and the power transistor T1 and the second cold temperature sensor CS is placed apart or in a further distance from the active area Ch_n and the power transistor T1 than the first hot temperature sensor HS. Alternatively, the first hot temperature sensor HS can be placed within or close to the heat source, active areas or channels of the power-chip.

The power transistor T1 has its drain connected to a voltage supply VS provided with battery voltage. The output OUT of the power transistor T1 is connected to an external load and the Gate $G_N$ of the power transistor T1 is connected to switch on the power transistor. The hot temperature sensor HS that is embedded in the hottest region of the power transistor T1, and the cold temperature sensor CS is placed outside the power transistor T1 in the coldest region of the power-chip. The cold temperature sensor CS is used for the so called delta-temperature protection providing a temperature reference value for the measurement with hot temperature sensor HS.

TSn designates the voltage drop generated over the hot temperature sensor HS, once the hot temperature sensor HS is biased with a current source 11. TSref designates the voltage drop generated over the cold temperature sensor CS, once the cold temperature sensor CS is biased with a current source 11. Tgnd designates the ground reference from the power-chip that must be connected to internal ground of the chip.

Furthermore, a control-chip is provided comprising circuits located in the control-chip to determine the temperature information using the information received from the temperature sensors HS and CS placed in the power-chip. In the control-chip, C1 designates a comparator adapted to provide an over-temperature information flag OT_flag to the logic of the control chip. The comparator C1 is adapted to compare the voltage drop TSn generated over the hot temperature sensor HS with an internal voltage reference OTref. This internal voltage reference OTref value may be set around 175° C. and represents the absolute temperature protection value.

C2 designates a comparator adapted to provide the delta-temperature information flag ΔT_flag to the logic of the control chip. The comparator C2 is adapted to compare the voltage drop TSn generated over the hot temperature sensor HS with the voltage drop TSref generated over the cold temperature sensor CS. The threshold is called ΔTref and it is set dependent on the application requirements. The threshold ΔTref can be adjusted based on detected dynamic temperature conditions, a sample and hold time condition to check T_check_ΔT and the restart time Trestart_ΔT.

The following examples make parenthetical references to elements shown in the FIGS. and/or discussed herein. The parenthetical references are exemplary and should not necessarily be considered limiting of the features being described.

Example 1

A semiconductor circuit arrangement, comprising:
a power semiconductor device with at least one active area (Ch_n, T1);
a first temperature sensor (HS) embedded in the power semiconductor device (power-chip);
wherein the first temperature sensor (HS) is placed within or close to the at least one active area (Ch_n, T1); and
a second temperature sensor (CS) embedded in the power semiconductor device (power-chip);
wherein the second temperature sensor (CS) is placed apart from the at least one active area (Ch_n, T1) in a further distance from the at least one active area (Ch_n, T1) than the first temperature sensor (HS).

Example 2

The semiconductor circuit arrangement of example 1, wherein:
the first temperature sensor (HS) is placed at a position where the highest temperature during operation of the power semiconductor device (power-chip) occur; and
the second temperature sensor (CS) is placed at a position where the lowest temperature during operation of the power semiconductor device (power-chip) occur.

Example 3

The semiconductor circuit arrangement of any of examples 1 or 2, further comprising:
at least one comparator (C1, C2) configured to compare measurement signals received from the first and second temperature sensors (HS, CS).

Example 4

The semiconductor circuit arrangement according to any of examples 1-3, further comprising:
control logic circuit configured to evaluate results of the at least one comparator (C1, C2) and/or measurement signals of the first and second temperature sensors (HS, CS).

Example 5

The semiconductor circuit arrangement according to any of examples 1-4, wherein the control logic circuit is configured to generate at least one alert signal or flag ($\Delta T\_flag$, $OT\_flag$) based on the results of the at least one comparator (C1, C2) and/or based on the measurement signals of the first and second temperature sensors (HS, CS).

Example 6

The semiconductor circuit arrangement according to any of examples 1-5, wherein the control logic circuit is configured to perform one or more of:
compare the temperature measured by the first and/or second temperature sensor (HS, CS) with a predetermined temperature threshold ($\Delta T\_threshold$);
detect a temperature difference between the first temperature sensor (HS) and the second temperature sensor (CS);
detect an over-temperature condition of the at least one active area (Ch_n, T1);
detect an over-current condition of the at least one active area (Ch_n, T1);
detect a short-circuit condition of the power semiconductor device (power-chip);
switch off operation of the at least one active area (Ch_n, T1) and/or the power semiconductor device (power-chip);
initiate restart of operation of the at least one active area (Ch_n, T1) and/or the power semiconductor device (power-chip);
initiate repeated restart of operation of the at least one active area (Ch_n, T1) and/or the power semiconductor device (power-chip);
count the number of restarts of operation of the at least one active area (Ch_n, T1) and/or the power semiconductor device (power-chip);
limit the number of restarts of operation of the at least one active area (Ch_n, T1) and/or the power semiconductor device (power-chip);
install a first waiting time ($Trestart\_\Delta T$) before a restart of operation of the at least one active area (Ch_n, T1) and/or the power semiconductor device (power-chip);
install a second waiting time ($T_{wait}$) before a repeated restart of operation of the at least one active area (Ch_n, T1) and/or the power semiconductor device (power-chip);
initiate measurement of the first and second temperature sensors (HS, CS);
initiate repeated measurement of the first and second temperature sensors (HS, CS);
initiate repeated measurement of the temperature difference between the first and second temperature sensors (HS, CS);
initiate repeated measurement of the first and second temperature sensors (HS, CS) after a predetermined time period after the switch-off due to an over-current detection in the at least one active area (Ch_n, T1) and/or the power semiconductor device (power-chip);
count the number of measurements of the first and second temperature sensors (HS, CS);
limit the number of measurements of the first and second temperature sensors (HS, CS);
install a third waiting time ($Tcheck\_\Delta T$) before a repeated measurement of the first and second temperature sensors (HS, CS);
install a fourth waiting time before a repeated restart of operation of the power semiconductor device (power-chip);
install a fifth waiting time between measurements of the first temperature sensor (HS) and measurements of the second temperature sensor (CS);
perform a demagnetization phase within the power semiconductor device (power-chip);
vary or adjust any waiting times and/or thresholds.

Example 7

The semiconductor circuit arrangement according to any of examples 1-6, wherein the control logic circuit is configured to switch off operation of the at least one active area (Ch_n, T1) and/or the power semiconductor device (power-chip), if one ore more of the following conditions are detected:
the temperature of the first and/or second temperature sensor (HS, CS) exceeds a predetermined temperature threshold ($\Delta T\_threshold$);

the number of restarts of operation of the at least one active area (Ch_n, T1) and/or the power semiconductor device (power-chip) exceeds a predetermined threshold;

the number of measurements of the first and second temperature sensors (HS, CS) exceeds a predetermined threshold;

the temperature of the first and/or second temperature sensor (HS, CS) does not fall under a predetermined threshold within a predetermined time period after switch off operation of the at least one active area (Ch_n, T1) and/or the power semiconductor device (power-chip).

Example 8

The semiconductor circuit arrangement according to any of examples 1-7, wherein the control logic circuit is configured to restart of operation of the at least one active area (Ch_n, T1) and/or the power semiconductor device (power-chip), if one ore more of the following conditions are detected:

the temperature of the first temperature sensor (HS) is lower than a predetermined threshold;

the temperature of the second temperature sensor (CS) is lower than a predetermined threshold;

the temperature difference between of the first and/or second temperature sensor (HS, CS) is lower than a predetermined threshold;

a sixth waiting time after switch off operation of the at least one active area (Ch_n, T1) and/or the power semiconductor device (power-chip) exceeds a predetermined threshold.

Example 9

The semiconductor circuit arrangement according to any of examples 1-8, wherein the control logic circuit is configured to control power supply (VS) for the at least one active area (Ch_n, T1) and/or the power semiconductor device (power-chip) based on the evaluation of the measurement signals from the first and second temperature sensors (HS, CS).

Example 10

The semiconductor circuit arrangement according to any of examples 1-9, wherein the control logic circuit and/or the at least one comparator (C1, C2) is arranged on a control chip (control-chip).

Example 11

A method for operating a power semiconductor circuit arrangement comprising a power semiconductor device (power-chip) with at least one active area (Ch_n, T1), the method comprising:

measuring a first temperature using a first temperature sensor (HS) embedded in the power semiconductor device (power-chip) and placed within or close to the at least one active area (Ch_n, T1);

measuring a second temperature using a second temperature sensor (CS) embedded in the power semiconductor device (power-chip) and placed apart from the at least one active area (Ch_n, T1) in a further distance from the at least one active area (Ch_n, T1) than the first temperature sensor (HS); and evaluating the measurement signals from the first and second temperature sensors (HS, CS).

Example 12

The method according to example 11, further comprising:
comparing the measurement signals received from the first and second temperature sensors (HS, CS).

Example 13

The method according to any of examples 11 or 12, further comprising:
evaluating results of the at least one comparator (C1, C2) and/or measurement signals of the first and second temperature sensors (HS, CS).

Example 14

The method according to any of examples 11-13, further comprising:
generating at least one alert signal or flag ($\Delta T\_flag$, $OT\_flag$) based on the results of the at least one comparator (C1, C2) and/or based on the measurement signals of the first and second temperature sensors (HS, CS).

Example 15

The method according to any of examples 11-14, further comprising one or more of:
comparing the temperature measured by the first and/or second temperature sensor (HS, CS) with a predetermined temperature threshold ($\Delta T\_threshold$);
detecting a temperature difference between the first temperature sensor (HS) and the second temperature sensor (CS);
detecting an over-temperature condition of the at least one active area (Ch_n, T1);
detecting an over-current condition of the at least one active area (Ch_n, T1);
detecting a short-circuit condition of the power semiconductor device (power-chip);
switching off operation of the at least one active area (Ch_n, T1) and/or the power semiconductor device (power-chip);
initiating restart of operation of the at least one active area (Ch_n, T1) and/or the power semiconductor device (power-chip);
initiating repeated restart of operation of the at least one active area (Ch_n, T1) and/or the power semiconductor device (power-chip);
counting the number of restarts of operation of the at least one active area (Ch_n, T1) and/or the power semiconductor device (power-chip);
limiting the number of restarts of operation of the at least one active area (Ch_n, T1) and/or the power semiconductor device (power-chip);
installing a first waiting time ($Trestart\_\Delta T$) before a restart of operation of the at least one active area (Ch_n, T1) and/or the power semiconductor device (power-chip);
installing a second waiting time ($T_{wait}$) before a repeated restart of operation of the at least one active area (Ch_n, T1) and/or the power semiconductor device (power-chip);

initiating measurement of the first and second temperature sensors (HS, CS);

initiating repeated measurement of the first and second temperature sensors (HS, CS);

initiating repeated measurement of the temperature difference between the first and second temperature sensors (HS, CS);

initiating repeated measurement of the first and second temperature sensors (HS, CS) after a predetermined time period after the switch-off due to an over-current detection in the at least one active area (Ch_n, T1) and/or the power semiconductor device (power-chip);

counting the number of measurements of the first and second temperature sensors (HS, CS);

limiting the number of measurements of the first and second temperature sensors (HS, CS);

installing a third waiting time (Tcheck_$\Delta$T) before a repeated measurement of the first and second temperature sensors (HS, CS);

installing a fourth waiting time before a repeated restart of operation of the power semiconductor device (power-chip);

installing a fifth waiting time between measurements of the first temperature sensor (HS) and measurements of the second temperature sensor (CS);

performing a demagnetization phase within the power semiconductor device (power-chip);

varying or adjusting any waiting times and/or thresholds.

Example 16

The method according to any of examples 11-15, wherein operation of the at least one active area (Ch_n, T1) and/or the power semiconductor device (power-chip) is switched off, if one ore more of the following conditions are detected:
the temperature of the first and/or second temperature sensor (HS, CS) exceeds a predetermined temperature threshold ($\Delta$T_threshold);
the number of restarts of operation of the at least one active area (Ch_n, T1) and/or the power semiconductor device (power-chip) exceeds a predetermined threshold;
the number of measurements of the first and second temperature sensors (HS, CS) exceeds a predetermined threshold;
the temperature of the first and/or second temperature sensor (HS, CS) does not fall under a predetermined threshold within a predetermined time period after switch off operation of the at least one active area (Ch_n, T1) and/or the power semiconductor device (power-chip).

Example 17

The method according to any of examples 11-16, wherein operation of the at least one active area (Ch_n, T1) and/or the power semiconductor device (power-chip) is restarted, if one ore more of the following conditions are detected:
the temperature of the first temperature sensor (HS) is lower than a predetermined threshold;
the temperature of the second temperature sensor (CS) is lower than a predetermined threshold;
the temperature difference between of the first and/or second temperature sensor (HS, CS) is lower than a predetermined threshold;
a sixth waiting time after switch off operation of the at least one active area (Ch_n, T1) and/or the power semiconductor device (power-chip) exceeds a predetermined threshold.

Example 18

The method according any of examples 11-17, further comprising controlling power supply (VS) for the at least one active area (Ch_n, T1) and/or the power semiconductor device (power-chip) based on the evaluation of the measurement signals from the first and second temperature sensors (HS, CS).

In conclusion, the techniques and/or devices of the present disclosure makes it possible to adapt the thermal observer with different packages and silicon thermal properties by varying and adjusting three different parameters:

T_check_$\Delta$T: fixed time where to check the dynamic temperature

Trestart_$\Delta$T: restart time $\Delta$T threshold: temperature threshold detection The present disclosure proposes the placing of temperature sensors embedded in the power semiconductor chip. In this, at least one of the embedded temperature sensors is placed close to the heat source, active areas or channels of the power semiconductor circuit, and at least one of the embedded temperature sensors is placed more apart from the heat source, active areas or channels of the power semiconductor circuit. furthermore, a new the temperature measurement method is provided, with timing of the temperature measurement and adjusting measurement parameters to appropriate threshold values.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

The invention claimed is:

1. A semiconductor circuit arrangement, comprising:
a power semiconductor device comprising at least one active area;
a first temperature sensor embedded in the power semiconductor device, wherein the first temperature sensor is placed within or close to the at least one active area;
a second temperature sensor embedded in the power semiconductor device, wherein the second temperature sensor is placed apart from the at least one active area in a further distance from the at least one active area than the first temperature sensor; and
a control circuit,
wherein the control circuit detects a switch-off of the power semiconductor device,
wherein the control circuit detects a temperature difference between a first temperature measured by the first temperature sensor and a second temperature measured by the second temperature sensor after a predetermined time duration has elapsed after detecting the switch-off of the power semiconductor device, and wherein the control circuit restarts the power semiconductor device when the temperature difference is lower than a predetermined threshold.

2. The semiconductor circuit arrangement of claim 1, wherein
the first temperature sensor is embedded in the power semiconductor device at a position where the highest temperature during operation of the power semiconductor device occurs; and
the second temperature sensor is embedded in the power semiconductor device at a position where the lowest temperature during operation of the power semiconductor device occurs.

3. The semiconductor circuit arrangement of claim 1, further comprising:
at least one comparator configured to compare measurement signals received from the first and second temperature sensors.

4. The semiconductor circuit arrangement of claim 3, wherein the control circuit detects the temperature difference by at least evaluating at least one of results of the at least one comparator and measurement signals of the first and second temperature sensors.

5. The semiconductor circuit arrangement of claim 4, wherein the control circuit generates at least one alert signal or flag based on at least one of the results of the at least one comparator and the measurement signals of the first and second temperature sensors.

6. The semiconductor circuit arrangement of claim 5, wherein the predetermined threshold is a first predetermined threshold, wherein the predetermined time duration is a first predetermined time duration, and wherein the control circuit is configured to perform one or more of:
compare the temperature measured by the first or second temperature sensor with a second predetermined threshold;
detect the temperature difference between the first temperature sensor and the second temperature sensor;
detect an over-temperature condition of the at least one active area;
detect an over-current condition of the at least one active area;
detect a short-circuit condition of the power semiconductor device;
switch off operation of the at least one active area or the power semiconductor device;
initiate restart of operation of the at least one active area or the power semiconductor device;
initiate repeated restart of operation of the at least one active area or the power semiconductor device;
count the number of restarts of operation of the at least one active area or the power semiconductor device;
limit the number of restarts of operation of the at least one active area or the power semiconductor device;
install a first waiting time before a restart of operation of the at least one active area or the power semiconductor device;
install a second waiting time before a repeated restart of operation of the at least one active area or the power semiconductor device;
initiate measurement of the first and second temperature sensors;
initiate repeated measurement of the first and second temperature sensors;
initiate repeated measurement of the temperature difference between the first and second temperature sensors;
initiate repeated measurement of the first and second temperature sensors after a second predetermined time duration after the switch-off due to an over-current detection in the at least one active area or the power semiconductor device;
count the number of measurements of the first and second temperature sensors;
limit the number of measurements of the first and second temperature sensors;
install a third waiting time before a repeated measurement of the first and second temperature sensors;
install a fourth waiting time before a repeated restart of operation of the power semiconductor device;
install a fifth waiting time between measurements of the first temperature sensor and measurements of the second temperature sensor;
perform a demagnetization phase within the power semiconductor device;
vary or adjust any waiting times or thresholds.

7. The semiconductor circuit arrangement of claim 6, wherein the control circuit is configured to switch off operation of the at least one active area or the power semiconductor device, if one or more of the following conditions are detected:
the temperature of the first or second temperature sensor exceeds a third predetermined threshold;
the number of restarts of operation of the at least one active area or the power semiconductor device exceeds a fourth predetermined threshold;
the number of measurements of the first and second temperature sensors exceeds a fifth predetermined threshold;
the temperature of the first or second temperature sensor does not fall under a sixth predetermined threshold within a third predetermined time duration after switching off operation of the at least one active area or the power semiconductor device.

8. The semiconductor circuit arrangement of claim 7, wherein the control circuit is configured to restart operation of the at least one active area or the power semiconductor device, if one or more of the following conditions are detected:
the temperature of the first temperature sensor is lower than a seventh predetermined threshold;
the temperature of the second temperature sensor is lower than an eighth predetermined threshold;
the temperature difference between of the first or second temperature sensor is lower than a ninth predetermined threshold;
a sixth waiting time after switching off operation of the at least one active area or the power semiconductor device exceeds a tenth predetermined threshold.

9. The semiconductor circuit arrangement of claim 8, wherein the control circuit is configured to control power supply for the at least one active area or the power semiconductor device (power-chip) based on the evaluation of the measurement signals from the first and second temperature sensors.

10. The semiconductor circuit arrangement of claim 9, wherein the control circuit or the at least one comparator is arranged on a control chip.

11. The semiconductor circuit arrangement of claim 1, wherein the predetermined threshold is a first predetermined threshold,
wherein the predetermined time duration is a first predetermined time duration, wherein the control circuit latches the power semiconductor device when the temperature difference is greater than a second predetermined threshold after a second predetermined time duration has elapsed after detecting the switch-off of the power semiconductor device, and wherein the control circuit restarts the power semiconductor device, after latching the power semiconductor device, when the temperature difference is lower than a third predetermined threshold.

12. A method for operating a power semiconductor circuit arrangement comprising a power semiconductor device with at least one active area, the method comprising:

detecting a switch-off of the power semiconductor device;

measuring a first temperature using a first temperature sensor embedded in the power semiconductor device, wherein the first temperature sensor is placed within or close to the at least one active area, after a predetermined time duration has elapsed after detecting the switch-off of the power semiconductor device;

measuring a second temperature using a second temperature sensor embedded in the power semiconductor device, wherein the second temperature sensor is placed apart from the at least one active area in a further distance from the at least one active area than the first temperature sensor, after the predetermined time duration has elapsed after detecting the switch-off of the power semiconductor device;

detecting a temperature difference between the first temperature and the second temperature; and restarting the power semiconductor device when the temperature difference is lower than a predetermined threshold.

13. The method of claim 12, further comprising:

comparing measurement signals received from the first and second temperature sensors.

14. The method of claim 13, further comprising:

evaluating at least one of results of the at least one comparator and measurement signals of the first and second temperature sensors.

15. The method of claim 14, further comprising:

generating at least one alert signal or flag based on at least one of the results of the at least one comparator and the measurement signals of the first and second temperature sensors.

16. The method of claim 15, wherein the predetermined threshold is a first predetermined threshold, wherein the predetermined time duration is a first predetermined time duration, the method further comprising one or more of:

comparing the temperature measured by the first or second temperature sensor with a second predetermined threshold;

detecting the temperature difference between the first temperature sensor and the second temperature sensor;

detecting an over-temperature condition of the at least one active area;

detecting an over-current condition of the at least one active area;

detecting a short-circuit condition of the power semiconductor device;

switching off operation of the at least one active area or the power semiconductor device;

initiating restart of operation of the at least one active area or the power semiconductor device;

initiating repeated restart of operation of the at least one active area or the power semiconductor device;

counting the number of restarts of operation of the at least one active area or the power semiconductor device;

limiting the number of restarts of operation of the at least one active area or the power semiconductor device;

installing a first waiting time before a restart of operation of the at least one active area or the power semiconductor device;

installing a second waiting time before a repeated restart of operation of the at least one active area or the power semiconductor device;

initiating measurement of the first and second temperature sensors;

initiating repeated measurement of the first and second temperature sensors;

initiating repeated measurement of the temperature difference between the first and second temperature sensors;

initiating repeated measurement of the first and second temperature sensors after a second predetermined time duration after the switch-off due to an over-current detection in the at least one active area or the power semiconductor device;

counting the number of measurements of the first and second temperature sensors;

limiting the number of measurements of the first and second temperature sensors;

installing a third waiting time before a repeated measurement of the first and second temperature sensors;

installing a fourth waiting time before a repeated restart of operation of the power semiconductor device;

installing a fifth waiting time between measurements of the first temperature sensor and measurements of the second temperature sensor;

performing a demagnetization phase within the power semiconductor device;

varying or adjusting any waiting times or thresholds.

17. The method of claim 16, wherein operation of the at least one active area or the power semiconductor device is switched off, if one or more of the following conditions are detected:

the temperature of the first or second temperature sensor exceeds a third predetermined threshold;

the number of restarts of operation of the at least one active area or the power semiconductor device exceeds a fourth predetermined threshold;

the number of measurements of the first and second temperature sensors exceeds a fifth predetermined threshold;

the temperature of the first or second temperature sensor does not fall under a sixth predetermined threshold within a third predetermined time duration after switching off operation of the at least one active area or the power semiconductor device.

18. The method of claim 17, wherein operation of the at least one active area or the power semiconductor device is restarted, if one or more of the following conditions are detected:

the temperature of the first temperature sensor is lower than a seventh predetermined threshold;

the temperature of the second temperature sensor is lower than an eighth predetermined threshold;

the temperature difference between of the first or second temperature sensor is lower than a ninth predetermined threshold;

a sixth waiting time after switching off operation of the at least one active area or the power semiconductor device exceeds a tenth predetermined threshold.

19. The method of claim 18, further comprising controlling power supply for the at least one active area or the power semiconductor device based on the evaluation of the measurement signals from the first and second temperature sensors.

* * * * *